United States Patent
Hioka

(10) Patent No.: US 10,615,333 B2
(45) Date of Patent: Apr. 7, 2020

(54) SEMICONDUCTOR DEVICE

(71) Applicant: ABLIC Inc., Chiba-shi, Chiba (JP)

(72) Inventor: Takaaki Hioka, Chiba (JP)

(73) Assignee: ABLIC INC., Chiba (JP)

( * ) Notice: Subject to any disclaimer, the term of this patent is extended or adjusted under 35 U.S.C. 154(b) by 0 days.

(21) Appl. No.: 15/901,480

(22) Filed: Feb. 21, 2018

(65) Prior Publication Data
US 2018/0254407 A1    Sep. 6, 2018

(30) Foreign Application Priority Data

Mar. 2, 2017   (JP) ................................. 2017-039669

(51) Int. Cl.
| | |
|---|---|
| *H01L 43/04* | (2006.01) |
| *H01L 43/06* | (2006.01) |
| *G01R 33/07* | (2006.01) |
| *H01L 27/22* | (2006.01) |

(52) U.S. Cl.
CPC ............ *H01L 43/04* (2013.01); *G01R 33/077* (2013.01); *H01L 43/065* (2013.01); *H01L 27/22* (2013.01)

(58) Field of Classification Search
CPC ........ G06F 21/75; G06F 11/263; G06F 21/71; G06F 21/55; G06F 2221/034; G09C 1/00; H04L 9/002; H04L 2209/12; H04L 2209/046
USPC ...................................................... 257/427
See application file for complete search history.

(56) References Cited

U.S. PATENT DOCUMENTS

| | | | |
|---|---|---|---|
| 2007/0290682 A1* | 12/2007 | Oohira | G01R 33/07 324/251 |
| 2012/0286776 A1* | 11/2012 | Ausserlechner | G01R 33/07 324/251 |
| 2014/0210023 A1* | 7/2014 | Wang | H01L 43/065 257/421 |
| 2016/0018478 A1 | 1/2016 | Hebert | |
| 2016/0146906 A1* | 5/2016 | Suzuki | G01R 33/077 257/424 |

FOREIGN PATENT DOCUMENTS

JP        5966060 B2     8/2016

OTHER PUBLICATIONS

Extended European Search Report for European Application No. 18155988.1, dated Aug. 16, 2018, pp. 1-5.

* cited by examiner

*Primary Examiner* — Marcos D. Pizarro
*Assistant Examiner* — Sue Tang
(74) *Attorney, Agent, or Firm* — Brinks Gilson & Lione

(57) ABSTRACT

The vertical Hall element includes: a semiconductor layer of a second conductivity type formed on a semiconductor substrate of a first conductivity type; a first electrode set formed in a surface of the semiconductor layer and including a first drive current supply electrode, a Hall voltage output electrode, and a second drive current supply electrode aligned along a straight line extending in a first direction in this order; and second to fifth electrode sets each having the same configuration as the configuration of the first electrode set and aligned with the first electrode set along a straight line extending in a second direction perpendicular to the first direction. The Hall voltage output electrode has a first depth, the first and second drive current supply electrodes have a second depth that is larger than the first depth.

9 Claims, 5 Drawing Sheets

SEMICONDUCTOR DEVICE

RELATED APPLICATIONS

This application claims priority under 35 U.S.C. § 119 to Japanese Patent Application No. 2017-039669 filed on Mar. 2, 2017, the entire content of which is hereby incorporated by reference.

BACKGROUND OF THE INVENTION

1. Field of the Invention

The present invention relates to a semiconductor device, and more particularly, to a semiconductor device that includes a vertical Hall element configured to detect a magnetic field in a horizontal direction.

2. Description of the Related Art

A Hall element is capable of detecting position or angle without contact as a magnetic sensor, and accordingly has various uses. While magnetic sensors that use a horizontal Hall element configured to detect magnetic field components perpendicular to a semiconductor substrate surface (vertical magnetic field) are particularly well known, there have been proposed various magnetic sensors that use a vertical Hall element configured to detect magnetic field components parallel to a substrate surface (horizontal magnetic field).

A vertical Hall element is generally configured to detect a horizontal magnetic field by utilizing both of a current that flows in a direction perpendicular to a substrate and a current that flows in a direction parallel to the substrate.

Meanwhile, in recent years, there has been proposed the following vertical Hall element, which is disclosed in Japanese Patent No. 5966060, for example. In the vertical Hall element, a current that flows in a direction perpendicular to a substrate is reduced while a current that flows in a direction parallel to the substrate is increased, and the vertical Hall element is configured to detect a horizontal magnetic field by positively utilizing the increased current in the direction parallel to the substrate.

The vertical Hall element disclosed in Japanese Patent No. 5966060 includes trenches formed in the semiconductor substrate, an insulating film formed on the inner side surface of each of the trenches, a conductor embedded in each of the trenches via the insulating film, and a high-concentration contact region connected to the conductor and formed in the bottom portion of each of the trenches. The conductor embedded in each of the trenches and the contact region connected thereto function as a drive current supply electrode.

In such a configuration, when a current is supplied between two drive current supply electrodes, the current flows between the contact regions formed in the bottom portions of the trenches. Hence, this configuration can almost completely eliminate current components in the direction perpendicular to the surface of the substrate and make most of the current to flow in the direction parallel to the surface of the substrate.

The structure of Japanese Patent No. 5966060, however, has a problem given below.

As described above, when a current is supplied between the two drive current supply electrodes, most of the current flows in the direction parallel to the surface of the substrate. This current (flow) concentrates in particular along the shortest path between the contact regions in the semiconductor substrate, which is a magnetism sensing portion. This means that almost no current flows to regions of the magnetism sensing portion that are located below the contact regions and are near the rear surface of the substrate. Further, the insulating film is formed on the inner side surface of the trench, in which the conductor of the drive current supply electrode is embedded, and hence the current hardly flows to a region of the magnetism sensing portion that is located between the side walls of the two trenches. As a result, the current that flows in the direction parallel to the substrate has a small width in a depth direction of the substrate.

The magnetic sensitivity of a Hall element is known to rise in proportion to the width of a current that flows through the Hall element. In the structure of Japanese Patent No. 5966060, however, the width of the current that flows in the direction parallel to the substrate is small as described above, and as a result, the sensitivity is only slightly improved.

Further, a Hall element is known to output a so-called offset voltage even when no magnetic field is applied thereto. It is required to remove the offset voltage when the Hall element is used as a magnetic sensor.

In order to remove the offset voltage (perform offset cancellation) in a vertical Hall element by a spinning current technique, which is known as an offset voltage removal method, a plurality of electrodes aligned along a straight line need to be configured so that the role of a drive current supply electrode and the role of a Hall voltage output electrode can be switched alternately, and it is necessary to switch current flow direction.

However, in the structure of Japanese Patent No. 5966060, as described above, while the drive current supply electrode consists of the conductor embedded in the trench via the insulating film and the contact region connected to the bottom portion of the trench, the Hall voltage output electrode consists of the contact region formed in the surface of the semiconductor substrate.

When the electrodes are switched between the role of the drive current supply electrode and the role of the Hall voltage output electrode in this configuration, between two drive current supply electrodes which are the contact regions formed in the surface of the semiconductor substrate, there exists the trench portion of the Hall voltage output electrode which includes the conductor embedded in the trench via the insulating film and the contact region connected to the bottom portion of the trench. Since the insulating film is formed on the inner side surface of the trench, the insulating film in the trench blocks the current flow when one tries to make a current flow between the drive current supply electrodes in the surface of the semiconductor substrate. This means that it is quite difficult to perform offset cancellation in the structure of Japanese Patent No. 5966060 by the spinning current technique.

SUMMARY OF THE INVENTION

It is therefore an object of the present invention to provide a semiconductor device including a vertical Hall element that is improved in sensitivity obtained by a current that flows in a direction parallel to a substrate and is capable of performing offset cancellation by the spinning current technique.

In one embodiment of the present invention, there is provided a semiconductor device including: a semiconductor substrate of a first conductivity type; and a vertical Hall element formed on the semiconductor substrate, the vertical Hall element including: a semiconductor layer of a second conductivity type formed on the semiconductor substrate; a first electrode set formed in a surface of the semiconductor layer and including a first drive current supply electrode, a Hall voltage output electrode, and a second drive current supply electrode aligned along a straight line extending in a first direction in this order; second to fifth electrode sets each having the same configuration as the configuration of the first electrode set and aligned with the first electrode set along a straight line extending in a second direction perpendicular to the first direction; and four electrode isolation diffusion layers of the first conductivity type formed in the surface of the semiconductor layer and each configured to isolate adjacent electrode sets of the first to fifth electrode sets from each other, wherein the Hall voltage output electrode has a first depth, each of the first drive current supply electrode and the second drive current supply electrode has a second depth that is larger than the first depth and the depth of the four electrode isolation diffusion layers.

According to the present invention, the drive current supply electrode is larger in depth than those of the Hall voltage output electrode and the electrode isolation diffusion layers in the second conductivity type semiconductor layer. Consequently, when a current flows between two drive current supply electrodes, the current flows in the direction parallel to the substrate, and flows widely in the semiconductor layer in its depth direction. That is, the current flows over the entire region from the bottom portions of the electrode isolation diffusion layers to the bottom portions of drive current supply electrodes. The magnetic sensitivity of the Hall element can therefore be increased.

Further, each of the first to fifth electrode sets which are aligned along the straight line extending in the second direction includes the first drive current supply electrode, the Hall voltage output electrode, and the second drive current supply electrode that are in this order aligned along the straight line extending in the first direction which is perpendicular to the second direction. Hence, offset cancellation can be performed by the spinning current technique in the following manner, for example.

Specifically, when currents are supplied in one direction and a reverse direction between the first and second drive current supply electrodes of the central electrode set, and the first and second drive current supply electrodes of each of the two electrode sets which are located on the ends, voltages that are consequently generated between the Hall voltage output electrode of the electrode set that is a second one from the end and the Hall voltage output electrode of the electrode set that is a fourth one from this end, and correspond to the respective currents in the one direction and the reverse direction can be obtained as two output voltages. In addition, when currents are supplied in the one direction and the reverse direction between the first and second drive current supply electrodes of the electrode set that is a second one from the end and the first and second drive current supply electrodes of the electrode set that is a fourth one from this end, voltages that are consequently generated between the Hall voltage output electrode of the central electrode set and the Hall voltage output electrodes of the two electrode sets which are located on the both ends, and correspond to the respective currents in the one direction and the reverse direction can be obtained as two output voltages. An offset voltage can be removed through addition and subtraction of the thus obtained four output voltages.

As a result, the semiconductor device that includes the highly sensitive vertical Hall element capable of performing offset cancellation can be provided.

BRIEF DESCRIPTION OF THE DRAWINGS

Embodiments of the invention will now be described, by way of example, with reference to the accompanying drawings, in which:

FIG. 4A and FIG. 4B are views for illustrating a modification example of the semiconductor device that includes the vertical Hall element according to the first embodiment of the present invention, in which FIG. 4A is a sectional view corresponding to FIG. 2A, and FIG. 4B is a sectional view corresponding to FIG. 3A;

DETAILED DESCRIPTION OF THE EMBODIMENTS

The invention will be now described herein with reference to illustrative embodiments.

First Embodiment

Figure 1A:
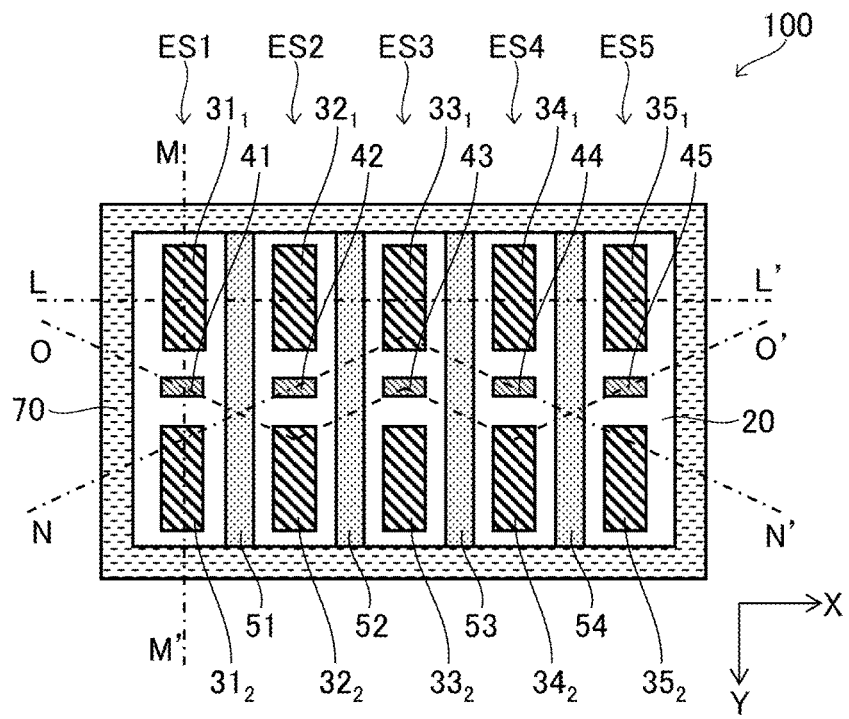
FIG. 1A is a plan view of a semiconductor device that includes a vertical Hall element according to a first embodiment of the present invention.
Figure 1B:
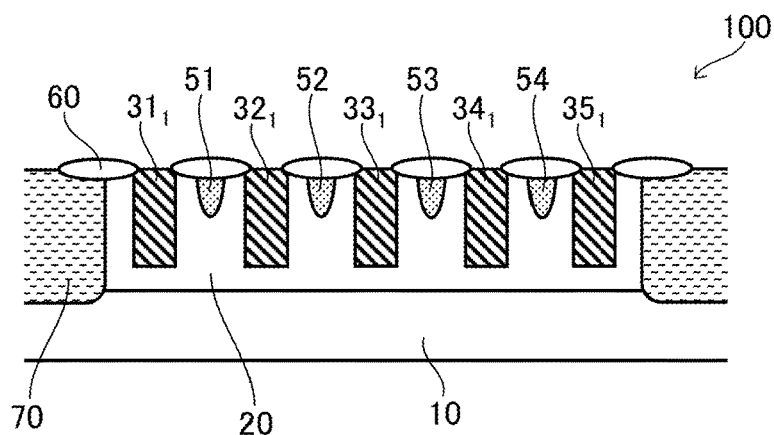
FIG. 1B is a sectional view taken along the line L-L' of FIG. 1A.
Figure 1C:
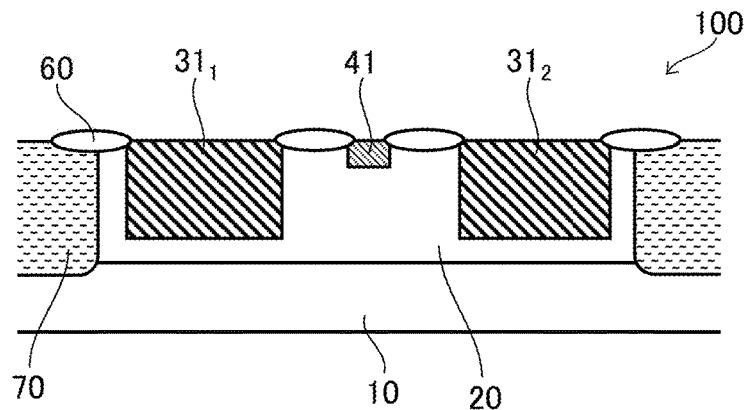
FIG. 1C is a sectional view taken along the line M-M' of FIG. 1A.

FIG. 1A to FIG. 1C are views for illustrating a semiconductor device that includes a vertical Hall element 100 according to a first embodiment of the present invention. FIG. 1A is a plan view of the semiconductor device, FIG. 1B is a sectional view taken along the line L-L' of FIG. 1A, and FIG. 1C is a sectional view taken along the line M-M' of FIG. 1A.

The semiconductor device of the first embodiment includes, as illustrated in FIG. 1A to FIG. 1C, a P-type (first conductivity type) semiconductor substrate 10, the vertical Hall element 100 provided on the semiconductor substrate 10, and a P-type element isolation diffusion layer 70 formed so as to surround the periphery of the vertical Hall element 100.

The vertical Hall element 100 includes an N-type (second conductivity type) semiconductor layer 20 formed on the semiconductor substrate 10, electrode sets ES1 to ES5 each of which includes a drive current supply electrode and a Hall voltage output electrode, and P-type electrode isolation diffusion layers 51 to 54. The electrode sets ES1 to ES5 are in sequence aligned along a straight line extending in an X direction (also referred to as "second direction") in the surface of the N-type semiconductor layer 20. The drive current supply electrode and the Hall voltage output electrode are N-type impurity regions. The P-type electrode isolation diffusion layers 51 to 54 are configured to isolate the adjacent electrode sets of the electrode sets ES1 to ES5 from each other.

In the electrode set ES1, a drive current supply electrode $31_1$, a Hall voltage output electrode 41, and a drive current supply electrode $31_2$ are arranged in this order aligned along a straight line extending in a Y direction (also referred to as "first direction").

During operation, the drive current supply electrode $31_1$ and the drive current supply electrode $31_2$ are applied with the same voltage to function as one drive current supply electrode 31. Hence, the drive current supply electrodes $31_1$ and $31_2$ are also collectively referred to as "drive current supply electrode 31" in the following description.

As illustrated in FIG. 1B and FIG. 1C, the drive current supply electrode 31 is formed to have a depth that is larger than the depths of the Hall voltage output electrode 41 and each of the electrode isolation diffusion layers 51 to 54.

Further, the drive current supply electrode 31 has a concentration that is substantially equal to the concentration of the Hall voltage output electrode 41.

The electrode sets ES2 to ES5 each have the same configuration as that of the electrode set ES1, and hence detailed description thereof is omitted.

The vertical Hall element 100 further includes an insulating film, for example, an $SiO_2$ film 60, so as to cover a surface of the N-type semiconductor layer 20, except for regions in which the drive current supply electrodes 31 to 35 and the Hall voltage output electrodes 41 to 45 are formed. This suppresses a current that flows in parallel to the semiconductor substrate 10 in the surface of the N-type semiconductor layer 20.

The element isolation diffusion layer 70 is formed so as to reach the P-type semiconductor substrate 10 in depth past the bottom of the N-type semiconductor layer 20. This electrically isolates the vertical Hall element 100 from other regions (not shown) on the semiconductor substrate 10.

In this vertical Hall element 100, the P-type electrode isolation diffusion layers 51 to 54 are formed by, for example, selectively diffusing P-type impurities in the N-type semiconductor layer 20.

Further, the drive current supply electrodes 31 to 35 and the Hall voltage output electrodes 41 to 45 are formed as follows, for example.

First, after the P-type electrode isolation diffusion layers 51 to 54 are formed, the $SiO_2$ film 60 is formed, for example, by LOCOS so that the $SiO_2$ film 60 covers the P-type electrode isolation diffusion layers 51 to 54 while avoiding regions in which the drive current supply electrodes 31 to 35 and the Hall voltage output electrodes 41 to 45 are to be formed. N-type impurities are then introduced with the $SiO_2$ film 60 used as a mask. The Hall voltage output electrodes 41 to 45 are formed in this way. At this time, N-type impurity regions that have the same depth as those of the Hall voltage output electrodes 41 to 45 are also formed in the regions in which the drive current supply electrodes 31 to 35 are to be formed. Here, the Hall voltage output electrodes 41 to 45 are formed to have a depth that is smaller than the depth of the P-type electrode isolation diffusion layers 51 to 54.

Subsequently, a resist having openings over the regions in which the drive current supply electrodes 31 to 35 are to be formed and covering the Hall voltage output electrodes 41 to 45 is formed. The N-type impurities are then introduced deeply with the resist used as a mask. The drive current supply electrodes 31 to 35 are formed in this way.

A description given next with reference to FIG. 2A, FIG. 2B, FIG. 3A, and FIG. 3B is about the principle of detecting a magnetic component that is in a direction parallel to the semiconductor substrate 10 in the vertical Hall element 100 of the semiconductor device according to the first embodiment.

Figure 2A:
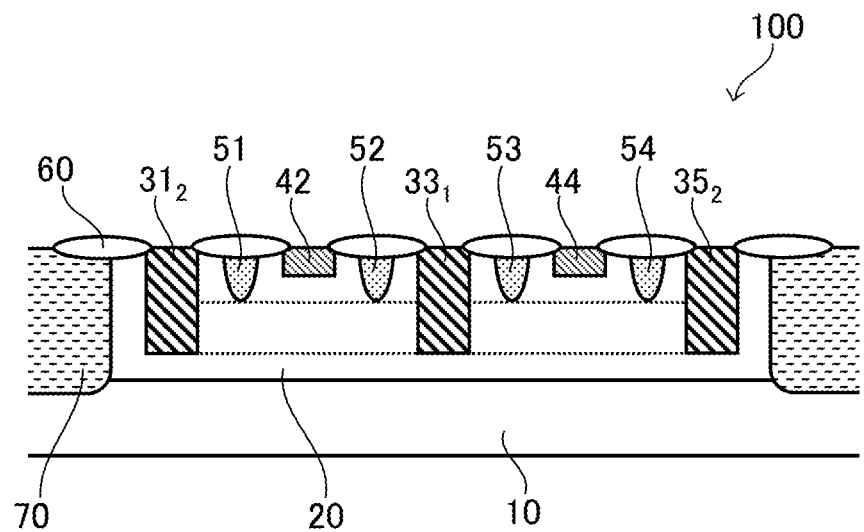
FIG. 2A is a sectional view taken along the line N-N' of FIG. 1A.
Figure 2B:
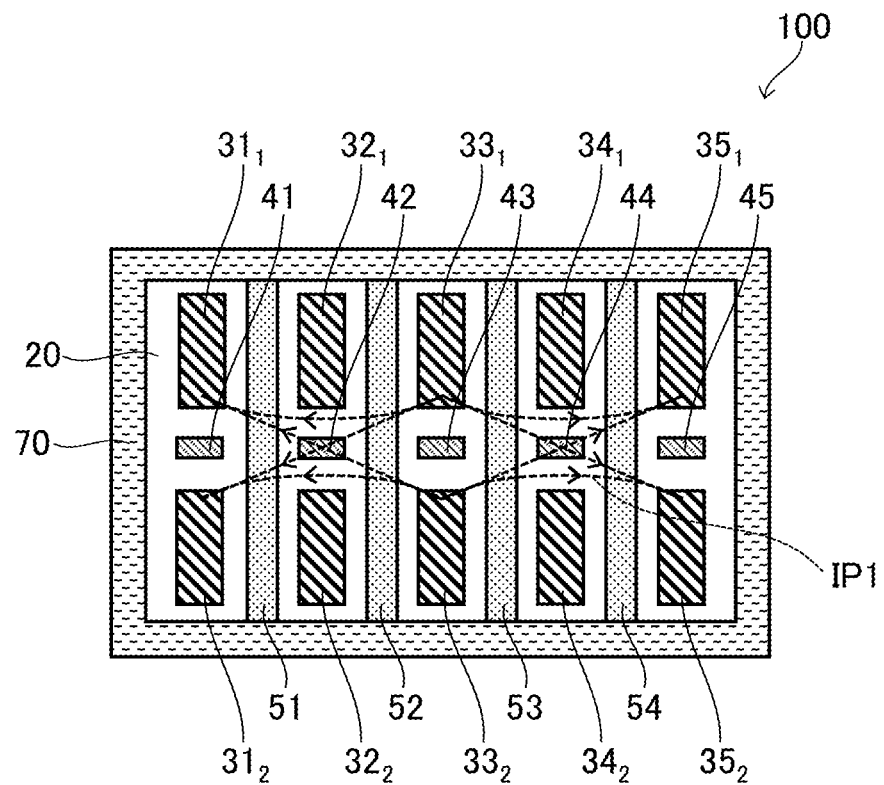
FIG. 2B is a schematic view for illustrating an example of a current flow caused in the semiconductor device that includes the vertical Hall element according to the first embodiment of the present invention.

FIG. 2A is a sectional view taken along the line N-N' of FIG. 1A. FIG. 2B is a view for schematically illustrating the states of currents that flow in the lower portions of the Hall voltage output electrodes 42 and 44 and near the Hall voltage output electrodes 42 and 44, which are observed when a drive current is supplied to drive the current supply electrodes 31, 33, and 35 so that the current flows from the drive current supply electrode 33 to the drive current supply electrodes 31 and 35 in the vertical Hall element 100 of the first embodiment.

In FIG. 2A, it is assumed that a magnetic field is applied from the back side to the front side on the drawing sheet in the direction parallel to the semiconductor substrate 10.

When a drive current is supplied to the drive current supply electrodes 31, 33, and 35 so that the current flows from the drive current supply electrode 33 to the drive current supply electrodes 31 and 35, the current flows from the drive current supply electrode 33 ($33_1$, $33_2$) to the drive current supply electrodes 31 ($31_1$, $31_2$) and 35 ($35_1$, $35_2$) in the directions parallel to the semiconductor substrate 10 in the N-type semiconductor layer 20, which is the magnetism sensing portion.

At this time, in the lower portions of the Hall voltage output electrodes 42 and 44 and near the Hall voltage output electrodes 42 and 44, the current flows in the entire region from the bottom portions of the P-type electrode isolation diffusion layers 51 to 54 to the bottom portions of the drive current supply electrodes 31, 33, and 35, which is illustrated by the dotted lines in FIG. 2A. In short, the current widely flows in a depth direction of the semiconductor layer 20.

Description is made by also referring to FIG. 2B. When a drive current is supplied so that the current flows from the drive current supply electrode 33 to the drive current supply electrodes 31 and 35, the current including current components from the drive current supply electrode $33_1$ to the drive current supply electrode $31_1$, from the drive current supply electrode $33_1$ to the drive current supply electrode $31_2$, from the drive current supply electrode $33_2$ to the drive current supply electrode $31_1$, from the drive current supply electrode $33_2$ to the drive current supply electrode $31_2$, from the drive current supply electrode $33_1$ to the drive current supply electrode $35_1$, from the drive current supply electrode $33_1$ to the drive current supply electrode $35_2$, from the drive current supply electrode $33_2$ to the drive current supply electrode $35_1$, and from the drive current supply electrode $33_2$ to the drive current supply electrode $35_2$ flows. Of those current components which flow in the respective directions, a magnetic field acts mainly on the current components as indicated by broken arrows IP1 in FIG. 2B which flow in the lower portions of the Hall voltage output electrodes 42 and 44 and near the Hall voltage output electrodes 42 and 44, to thereby generate an electromotive force in a direction perpendicular to the current and the magnetic field both.

Specifically, a Lorentz force is generated in a direction from the semiconductor substrate 10 to the Hall voltage output electrode 42 (upward direction) for the current that flows from the drive current supply electrode 33 to the drive current supply electrode 31 in the direction parallel to the semiconductor substrate 10, and a Lorentz force is generated in a direction from the Hall voltage output electrode 44 to the semiconductor substrate 10 (downward direction) for the current that flows from the drive current supply electrode 33 to the drive current supply electrode 35 in the direction parallel to the semiconductor substrate 10.

Consequently, a potential difference is generated between the Hall voltage output electrodes 42 and 44, and the magnetic field can be detected with the potential difference.

Further, also when a current flows in a reverse direction, that is, when a drive current is supplied so that the current flows from the drive current supply electrodes 31 and 35 to the drive current supply electrode 33, a magnetic field can be detected in the same manner as in the above-mentioned case.

Specifically, a magnetic field acts mainly on current components that flows in a direction reverse to the direction of the broken arrows IP1 in FIG. 2B, to thereby generate an electromotive force in a direction perpendicular to the current and the magnetic field both. A potential difference reverse to that in the case of FIG. 2B is consequently generated between the Hall voltage output electrodes 42 and 44, and the magnetic field can be detected by the potential difference.

Figure 3A:
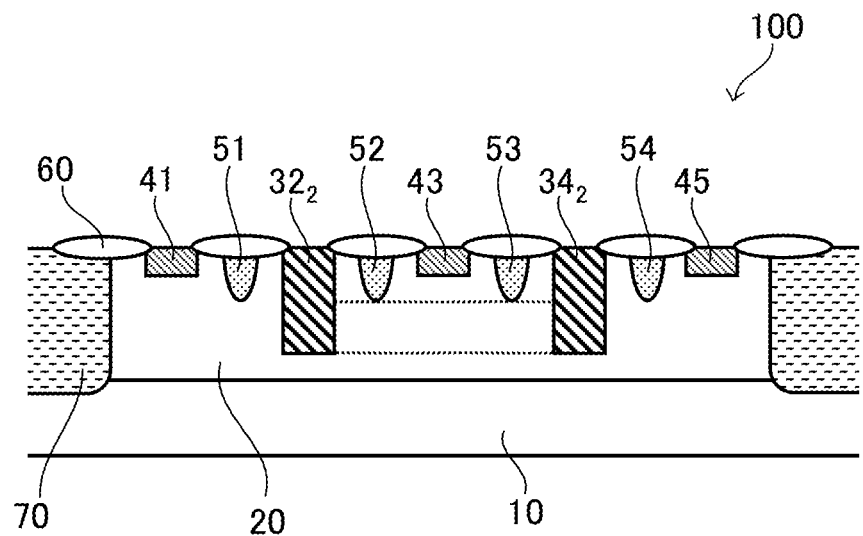
FIG. 3A is a sectional view taken along the line O-O' of FIG. 1A.
Figure 3B:
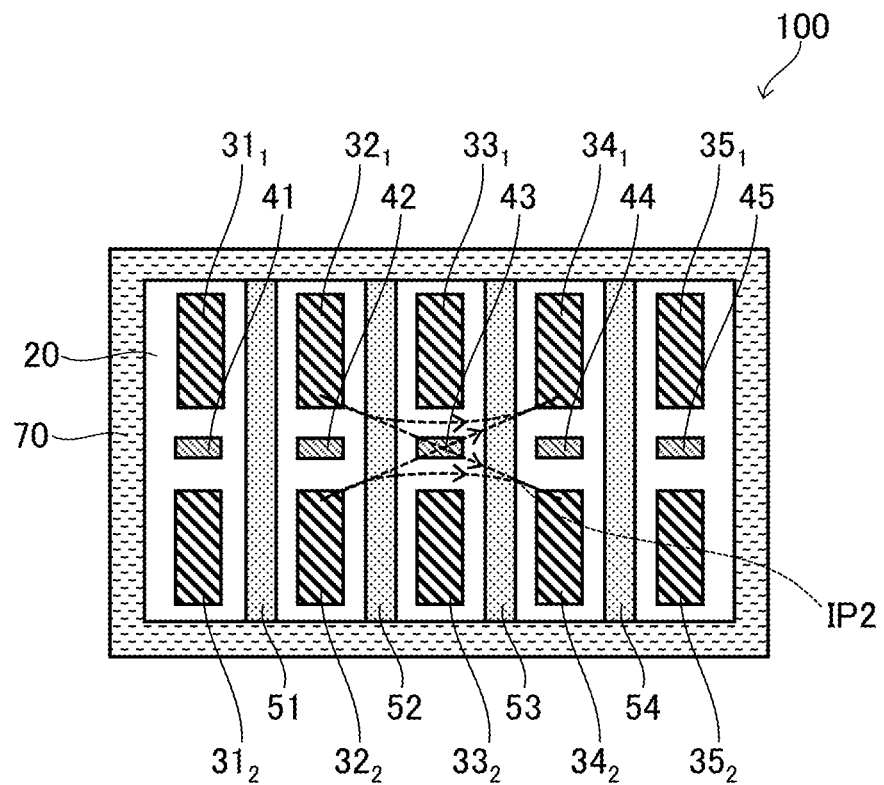
FIG. 3B is a schematic view for illustrating another example of a current flow with a current flowing in the sectional view of FIG. 3A caused in the semiconductor device that includes the vertical Hall element according to the first embodiment of the present invention.

FIG. 3A is a sectional view taken along the line O-O' of FIG. 1A. FIG. 3B is a view for schematically illustrating the state of current that flows in the lower portions of the Hall voltage output electrode 43 and near the Hall voltage output electrode 43, which is observed when a drive current is supplied to drive current supply electrodes 32 and 34 so that the current flows from the drive current supply electrode 32 to the drive current supply electrodes 34 in the vertical Hall element 100 of the first embodiment.

In FIG. 3A, it is assumed that a magnetic field is applied from the back side to the front side on the drawing sheet in the direction parallel to the semiconductor substrate 10.

Further, both of the Hall voltage output electrodes 41 and 45 are connected to a reference voltage.

When a drive current is supplied to the drive current supply electrodes 32 and 34 so that the current flows from the drive current supply electrode 32 to the drive current supply electrodes 34, the current flows from the drive current supply electrode 32 ($32_1$, $32_2$) to the drive current supply electrodes 34 ($34_1$, $34_2$) in the directions parallel to the semiconductor substrate 10 in the N-type semiconductor layer 20, which is the magnetism sensing portion.

At this time, in the lower portion of the Hall voltage output electrode 43 and near the Hall voltage output electrode 43, the current flows in the entire region from the bottom portions of the P-type electrode isolation diffusion layers 52 and 53 to the bottom portions of the drive current supply electrodes 32 and 34, which is illustrated by the dotted lines in FIG. 3A. In short, the current widely flows in a depth direction of the semiconductor layer 20.

Description is made by also referring to FIG. 3B. When a drive current is supplied so that the current flows from the drive current supply electrode 32 to the drive current supply electrode 34, the current including current components from the drive current supply electrode $32_1$ to the drive current supply electrode $34_1$, from the drive current supply electrode $32_1$ to the drive current supply electrode $34_2$, from the drive current supply electrode $32_2$ to the drive current supply electrode $34_1$, and from the drive current supply electrode $32_2$ to the drive current supply electrode $34_2$ flows. Of those current components which flow in the respective directions, a magnetic field acts mainly on the current components as indicated by broken arrows IP2 in FIG. 3B, which flow in the lower portion of the Hall voltage output electrode 43 and near the Hall voltage output electrode 43, to thereby generate an electromotive force in a direction perpendicular to the current and the magnetic field both.

Specifically, a Lorentz force is generated in a direction from the Hall voltage output electrode 43 to the semiconductor substrate 10 (downward direction) for the current that flows from the drive current supply electrode 32 to the drive current supply electrode 34 in the direction parallel to the semiconductor substrate 10.

Consequently, a potential difference is generated between the Hall voltage output electrode 43 and the Hall voltage output electrodes 41 and 45, and the magnetic field can be detected with the potential difference.

Further, also when a current flows in a reverse direction, that is, when a drive current is supplied so that the current flows from the drive current supply electrode 34 to the drive current supply electrode 32, a magnetic field can be detected in the same manner as in the above-mentioned case.

Specifically, a magnetic field acts mainly on current components that flows in a direction reverse to the direction of the broken arrows IP2 in FIG. 3B, to thereby generate an electromotive force in a direction perpendicular to the current and the magnetic field both. A potential difference reverse to that in the case of FIG. 3B is consequently generated between the Hall voltage output electrode 43 and the Hall voltage output electrodes 41 and 45, and the magnetic field can be detected by the potential difference.

As described above, the first embodiment can increase the width in the depth direction of a current that flows in the direction parallel to the semiconductor substrate 10 in both of the case in which a current flows between the drive current supply electrode 33 and the drive current supply electrodes 31 and 35, and the case in which a current flows between the drive current supply electrode 32 and the drive current supply electrode 34.

The magnetic sensitivity of a Hall element is in proportion to the width of a current that flows through the Hall element, and hence, according to the first embodiment, high magnetic sensitivity can be obtained. Thus, the N-type semiconductor layer 20 is preferably as thick as possible.

In the first embodiment, it is desired for the current to uniformly flow over the entire region illustrated by the dotted lines in FIG. 2A and FIG. 3A. Thus, the N-type semiconductor layer 20 preferably has a constant concentration distribution. The N-type semiconductor layer 20 with a constant concentration distribution can be achieved by making the N-type semiconductor layer 20 an epitaxial layer, for example.

In addition, the magnetic sensitivity of a Hall element is known to rise also in proportion to mobility. Hence, the concentration of the N-type semiconductor layer 20, which is the magnetism sensing portion, is preferably as low as possible, and is preferably from about $1 \times 10^{15}$ atoms/cm$^3$ to about $1 \times 10^{17}$ atoms/cm$^3$, for example.

As described above, according to the first embodiment, the magnetic sensitivity can be increased.

Next, there is described a method of removing an offset voltage by the spinning current technique in the semiconductor device that includes the vertical Hall element 100 of the first embodiment.

First, as described with reference to FIG. 2A and FIG. 2B, a drive current is supplied so that the current flows from the drive current supply electrode 33 to the drive current supply electrodes 31 and 35, and a voltage that is consequently generated between the Hall voltage output electrodes 42 and 44 is obtained as an output voltage Vout1. Further, the direction of the current flow is reversed, that is, a drive current is supplied so that the current flows from the drive current supply electrodes 31 and 35 to the drive current supply electrode 33, and a voltage that is consequently generated between the Hall voltage output electrodes 42 and 44 is obtained as an output voltage Vout2.

Next, as described with reference to FIG. 3A and FIG. 3B, a drive current is supplied so that the current flows from the drive current supply electrode 32 to the drive current supply electrode 34, and a voltage that is consequently generated between the Hall voltage output electrode 43 and the Hall voltage output electrodes 41 and 45 is obtained as an output voltage Vout3. Further, the direction of the current is reversed, that is, a drive current is supplied so that the current flows from the drive current supply electrode 34 to the drive current supply electrode 32, and a voltage that is consequently generated between the Hall voltage output electrode 43 and the Hall voltage output electrodes 41 and 45 is obtained as an output voltage Vout4.

The offset voltage can be removed by adding and subtracting those output voltages Vout1 to Vout4.

As described above, according to the first embodiment, the width of a current flowing between the drive current supply electrodes can be increased. With this, the magnetic sensitivity of the vertical Hall element 100 can be improved, and offset cancellation can be performed by the spinning current technique.

Consequently, with the use of the vertical Hall element 100 of the first embodiment, a highly accurate magnetic sensor can be provided.

Figure 4A:
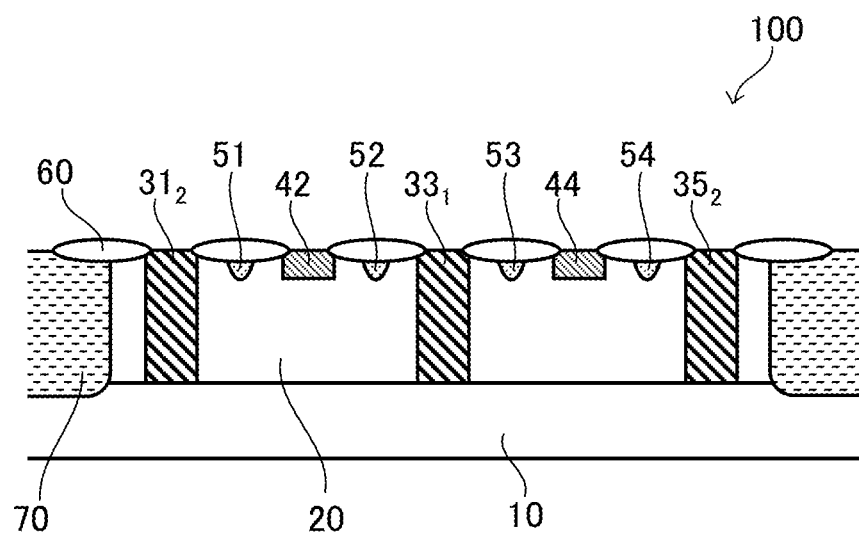
Figure 4B:
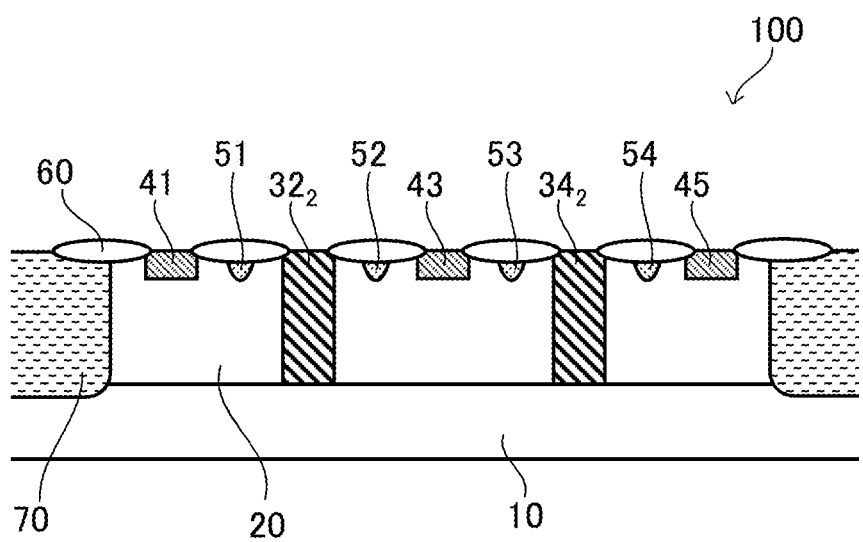

FIG. 4A and FIG. 4B are views for illustrating a modification example of the vertical Hall element 100 of the first embodiment. FIG. 4A is the view corresponding to the sectional view of FIG. 2A, and FIG. 4B is the view corresponding to the sectional view of FIG. 3A.

As illustrated in FIG. 4A and FIG. 4B, in the modification example, the drive current supply electrodes 31 to 35 have a depth that is substantially equal to the depth of the N-type semiconductor layer 20. This configuration allows a current to flow to near the boundary between the semiconductor layer 20 and the semiconductor substrate, and can achieve a large width in the depth direction of a current that flows in the direction parallel to the semiconductor substrate as compared to the examples illustrated in FIG. 2A and FIG. 3A.

Further, in the modification example, the electrode isolation diffusion layers 51 to 54 have a depth that is substantially equal to the depth of the Hall voltage output electrodes 41 to 45. This configuration allows a current to flow to near the Hall voltage output electrodes 42 to 44, and can achieve a larger width in the depth direction of a current.

In this way, the drive current supply electrodes 31 to 35 are preferably as deep as possible in the range of the thickness of the semiconductor layer 20, and the electrode isolation diffusion layers 51 to 54 are preferably as shallow as possible in a range that enables electrode isolation.

As described above, according to the modification example, the magnetic sensitivity can be more improved.

Second Embodiment

In the examples of the first embodiment described above, the drive current supply electrodes 31 to 35 have the concentration that is substantially equal to the concentration of the Hall voltage output electrodes 41 to 45, and have the depth that is different from that of the Hall voltage output electrodes 41 to 45.

In a second embodiment of the present invention, configuration of drive current supply electrodes is different from configuration of the drive current supply electrodes of the first embodiment described above.

For the purpose of easy understanding of the description, there is described an example in which the drive current supply electrodes 31 to 35 of the vertical Hall element 100 of the first embodiment illustrated in FIG. 1A to FIG. 1C are replaced with the drive current supply electrodes having the configuration according to the second embodiment.

Figure 5A:
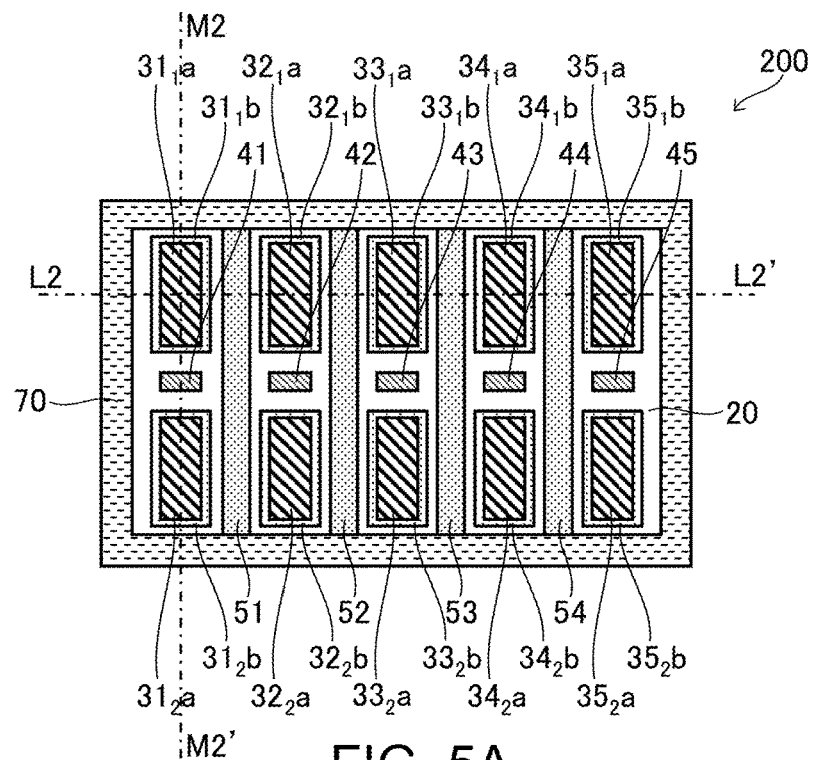
FIG. 5A is a plan view of a semiconductor device that includes a vertical Hall element according to a second embodiment of the present invention.
Figure 5B:
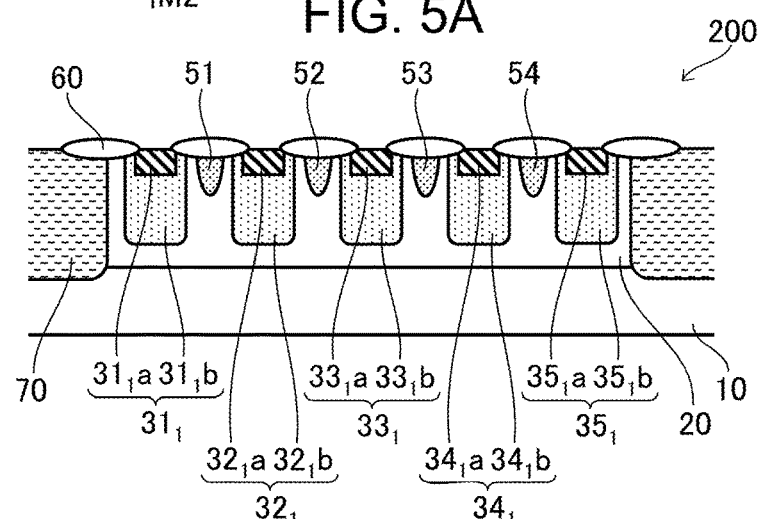
FIG. 5B is a sectional view taken along the line L2-L2' of FIG. 5A.
Figure 5C:
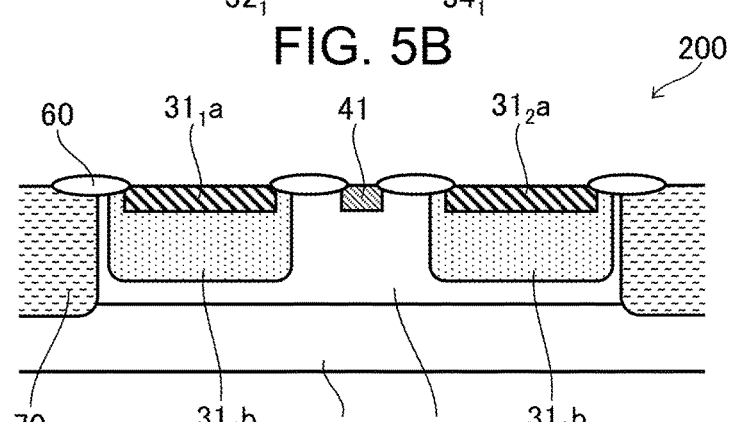
FIG. 5C is a sectional view taken along the line M2-M2' of FIG. 5A.

FIG. 5A to FIG. 5C are views for illustrating a semiconductor device that includes a vertical Hall element 200 according to the second embodiment of the present invention. FIG. 5A is a plan view of the semiconductor device, FIG. 5B is a sectional view taken along the line L2-L2' of FIG. 5A, and FIG. 5C is a sectional view taken along the line M2-M2' of FIG. 5A.

The same components as those of the semiconductor device having the vertical Hall element 100 illustrated in FIG. 1A to FIG. 1C are denoted by the same reference numerals, and redundant descriptions will be omitted as appropriate.

As illustrated in FIG. 5B, in the vertical Hall element 200, the drive current supply electrode $31_1$ includes N-type impurity layers $31_1a$ and $31_1b$, the drive current supply electrode $32_1$ includes N-type impurity layers $32_1a$ and $32_1b$, the drive current supply electrode $33_1$ includes N-type impurity layers $33_1a$ and $33_1b$, the drive current supply electrode $34_1$ includes N-type impurity layers $34_1a$ and $34_1b$, and the drive current supply electrode $35_1$ includes N-type impurity layers $35_1a$ and $35_1b$. Although not illustrated, the drive current supply electrodes $31_2$ to $35_2$ also have similar configurations.

The N-type impurity layers $31_1a$ to $35_1a$ are formed in the surface of the N-type impurity layers $31_1b$ to $35_1b$, respectively, and have substantially the same concentration and depth as those of the Hall voltage output electrode 41 (and the Hall voltage output electrodes 42 to 45).

Each of the N-type impurity layers $31_1b$ to $35_1b$ is formed to have a depth that is larger than those of the Hall voltage output electrode 41 (and the Hall voltage output electrodes 42 to 45) and the electrode isolation diffusion layers 51 to 54.

Further, each of the N-type impurity layers $31_1b$ to $35_1b$ has a concentration that is lower than that of the N-type impurity layers $31_1a$ to $35_1a$, and has a width that is larger than that of the N-type impurity layers $31_1a$ to $35_1a$.

Meanwhile, elements including transistors and others configuring a circuit for processing signals output from the vertical Hall element 200 or supplying signals to the vertical Hall element 200 are formed in other region (not shown) on the semiconductor substrate 10 that are electrically isolated from the vertical Hall element 200 by the P-type element isolation diffusion layer 70. At least an N-well is formed in at least a part of the region to form the elements.

Hence, the N-type impurity layers $31_1b$ to $35_1b$ (and $31_2b$ to $35_2b$) can be formed through processes that are common to those of the above-mentioned N-well. The N-well consequently has substantially the same depth and concentration distribution as those of the N-type impurity layers $31_1b$ to $35_1b$ (and $31_2b$ to $35_2b$).

As described above, according to the second embodiment, the drive current supply electrodes 31 to 35 which include the N-type impurity layers $31_1a$ to $35_1a$ (and $31_2a$ to $35_2a$) and the N-type impurity layers $31_1b$ to $35_1b$ (and $31_2b$ to $35_2b$) can be formed without an increase in number of manufacturing processes.

In order to further increase the width in the depth direction of a current, the drive current supply electrodes 31 to 35 according to the second embodiment are also preferably as deep as possible just like the drive current supply electrodes 31 to 35 according to the modification example of the vertical Hall element 100 of the first embodiment illustrated in FIG. 4A and FIG. 4B. In this case, it is preferred that the N-type impurity layers $31_1b$ to $35_1b$ (and $31_2b$ to $35_2b$) are made a larger depth while the depth of the N-type impurity layers $31_1a$ to $35_1a$ (and $31_2a$ to $35_2a$) are unchanged.

It is apparent that the present invention is not limited to the above embodiments, but may be modified and changed without departing from the scope and spirit of the invention.

For example, the first conductivity type as the P type and the second conductivity type as the N type in the embodiments described above may be switched to set the first conductivity as the N type and the second conductivity as the P type.

Further, in the examples of the embodiments described above, the vertical Hall elements 100 and 200 each include the five drive current supply electrodes 31 to 35 and the five Hall voltage output electrodes 41 to 45. The spinning current technique can, however, be performed when there are five or more drive current supply electrodes and five or more Hall voltage output electrodes, and hence the number of drive current supply electrodes and the number of Hall voltage output electrodes is respectively not limited to five.

What is claimed is:

1. A semiconductor device, comprising:
   a semiconductor substrate of a first conductivity type; and
   a vertical Hall element on the semiconductor substrate, the vertical Hall element comprising:
      a semiconductor layer of a second conductivity type on the semiconductor substrate;
      a first electrode set in a surface of the semiconductor layer and including a first drive current supply electrode, a Hall voltage output electrode, and a second drive current supply electrode aligned in sequence along a straight line extending in a first direction;
      second to fifth electrode sets each having a same configuration as the first electrode set and aligned with the first electrode set along a straight line extending in a second direction perpendicular to the first direction; and
      four electrode isolation diffusion layers of the first conductivity type in the surface of the semiconductor layer and each configured to isolate adjacent electrode sets of the first to fifth electrode sets from each other,
   the Hall voltage output electrodes having a first depth, and each of the first drive current supply electrodes and the second drive current supply electrodes having a second depth that is greater than the first depth and a depth of the four electrode isolation diffusion layers.

2. The semiconductor device according to claim 1, wherein each of the first and second drive current supply electrodes has an impurity concentration that is substantially equal to an impurity concentration of the Hall voltage output electrode.

3. The semiconductor device according to claim 1, wherein each of the first and second drive current supply electrodes comprises:
   a first impurity layer of the second conductivity type having the second depth; and
   a second impurity layer in a surface of the first impurity layer and having the first depth and an impurity concentration that is higher than a concentration of the first impurity layer.

4. The semiconductor device according to claim 3, wherein the second impurity layer has an impurity concentration that is substantially equal to an impurity concentration of the Hall voltage output electrode.

5. The semiconductor device according to claim 3, further comprising:
   an element isolation diffusion layer of the first conductivity type surrounding the vertical Hall element and electrically isolating the vertical Hall element from surroundings of the vertical Hall element; and
   an element formation region in a periphery of the element isolation diffusion layer that includes an element of a circuit for processing of a signal output from the vertical Hall element and supply of a signal to the vertical Hall element,
   wherein the element formation region comprises a well of the second conductivity type, and the well has a depth and an impurity concentration distribution that are substantially equal to the second depth and an impurity concentration distribution of the first impurity layer.

6. The semiconductor device according to claim 1, wherein the depth of the four electrode isolation diffusion layers is substantially equal to the first depth.

7. The semiconductor device according to claim 1, wherein the second depth each of the first and second drive current supply electrodes is substantially equal to a depth of the semiconductor layer.

8. The semiconductor device according to claim 1, wherein the semiconductor layer comprises an epitaxial layer.

9. The semiconductor device according to claim 1, wherein the surface of the semiconductor layer and surfaces of the four electrode isolation diffusion layers are covered with an insulating film except for the first drive current supply electrode, the second drive current supply electrode, and the Hall voltage output electrode.

\* \* \* \* \*